(12) United States Patent
Yeo et al.

(10) Patent No.: US 7,226,832 B2
(45) Date of Patent: Jun. 5, 2007

(54) COMPLEMENTARY METAL OXIDE SEMICONDUCTOR TRANSISTOR TECHNOLOGY USING SELECTIVE EPITAXY OF A STRAINED SILICON GERMANIUM LAYER

(75) Inventors: Yee-Chia Yeo, Albany, CA (US); Chun-Chieh Lin, Hsin-Chu (TW); Fu-Liang Yang, Hsin-Chu (TW); Chen Ming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/227,264

(22) Filed: Sep. 15, 2005

(65) Prior Publication Data
US 2006/0008958 A1    Jan. 12, 2006

Related U.S. Application Data

(63) Continuation of application No. 10/730,778, filed on Dec. 9, 2003, now Pat. No. 6,953,972, which is a continuation of application No. 10/002,031, filed on Nov. 30, 2001, now Pat. No. 6,703,271.

(51) Int. Cl.
*H01L 21/8238* (2006.01)

(52) U.S. Cl. ............... 438/221; 438/228; 438/300; 257/E21.632

(58) Field of Classification Search ............ 438/228, 438/300, 221; 257/E21.632
See application file for complete search history.

(56) References Cited

U.S. PATENT DOCUMENTS

| | | | |
|---|---|---|---|
| 4,830,975 A * | 5/1989 | Bovaird et al. | 438/589 |
| 5,019,882 A | 5/1991 | Solomon et al. | |
| 5,241,197 A | 8/1993 | Murakami et al. | |
| 5,534,713 A | 7/1996 | Ismail et al. | |
| 5,970,351 A * | 10/1999 | Takeuchi | 438/300 |
| 5,981,345 A | 11/1999 | Ryum et al. | |
| 5,985,703 A | 11/1999 | Banerjee | |
| 6,004,137 A | 12/1999 | Crabbe et al. | |
| 6,111,267 A | 8/2000 | Fischer et al. | |
| 6,187,641 B1 * | 2/2001 | Rodder et al. | 438/299 |
| 6,190,975 B1 | 2/2001 | Kubo et al. | |
| 6,346,447 B1 * | 2/2002 | Rodder | 438/300 |
| 6,346,729 B1 * | 2/2002 | Liang et al. | 257/344 |
| 6,703,271 B2 * | 3/2004 | Yeo et al. | 438/221 |
| 6,797,556 B2 * | 9/2004 | Murthy et al. | 438/231 |
| 6,887,762 B1 * | 5/2005 | Murthy et al. | 438/300 |
| 2002/0037610 A1 * | 3/2002 | Yseng | 438/197 |

* cited by examiner

*Primary Examiner*—Michael Lebentritt
*Assistant Examiner*—Richard A. Booth
(74) *Attorney, Agent, or Firm*—Haynes and Boone, LLP

(57) ABSTRACT

A CMOS integrated circuit includes a substrate having an NMOS region with a P-well and a PMOS region with an N-well. A shallow trench isolation (STI) region is formed between the NMOS and PMOS regions and a composite silicon layer comprising a strained SiGe layer is formed over said P well region and over said N well region. The composite silicon layer is disconnected at the STI region. Gate electrodes are then formed on the composite layer in the NMOS and PMOS regions.

9 Claims, 5 Drawing Sheets

COMPLEMENTARY METAL OXIDE SEMICONDUCTOR TRANSISTOR TECHNOLOGY USING SELECTIVE EPITAXY OF A STRAINED SILICON GERMANIUM LAYER

RELATED APPLICATIONS

This application is a continuation of U.S. Ser. No. 10/730,778 filed Dec. 9, 2003, now U.S. Pat. No. 6,953,972, which is a continuation of U.S. Ser. No. 10/002,031 filed on Nov. 30, 2001, now U.S. Pat. No. 6,703,271, both entitled, "Complementary Metal Oxide Semiconductor Transistor Technology Using Selective Epitaxy of a Strained Silicon Germanium Layer" and both of which are hereby incorporated by reference.

BACKGROUND

The present invention relates to methods used to fabricate semiconductor devices, and more specifically to a method used to increase the performance of complementary metal oxide semiconductor (CMOS), devices, via the use of a channel region comprised in part with a strained silicon-germanium layer.

An attractive approach for increasing CMOS transistor performance is the use of a silicon-germanium (SiGe) layer located in the channel region of the CMOS device. The biaxial stress in the SiGe layer, creating strain induced band structure modification, allows enhanced transport properties of electrons for N channel (NMOS) devices and enhanced transport properties of holes for P channel (PMOS), devices, to be realized. However the ability to place a SiGe layer in a region that will subsequently underlay the gate structure, as well as to subsequently accommodate shallow source/drain regions, can be challenging in terms of integrating the SiGe devices into a conventional CMOS process.

This disclosure will teach a process in which a SiGe layer is selectively grown on only the active device regions, eliminating the need for costly patterning procedures to remove portions of the SiGe layer overlying non-active device regions, such as insulator filled shallow trench regions. This invention will also describe a composite layer comprised with silicon layers overlying as well as underlying the SiGe component of the composite layer. The silicon layer overlying the SiGe layer, silicon cap layer, allows a gate insulator layer to be thermally grown consuming only a portion of the silicon cap layer. In addition, this invention will also describe the thickness and composition of the silicon cap, SiGe and silicon buffer layers, needed to accommodate the biaxial compressive strain needed for enhanced hole mobility in the PMOS channel region, and the strain induced energy splitting in the conduction band allowing enhanced electron transport properties to enhance electron velocity overshoot in the channel region of NMOS devices. Prior art, such as Ismail et al, in U.S. Pat. No. 5,534,713, describe the use of thick buffer layers, used with a SiGe layer, however the use of these thick layers may not allow for the easy integration into a conventional CMOS process as this present invention does.

SUMMARY

In one embodiment, a CMOS integrated circuit includes a substrate having an NMOS region with a P-well and a PMOS region with an N-well. A shallow trench isolation (STI) region is formed between the NMOS and PMOS regions and a composite silicon layer comprising a strained SiGe layer is formed over the P well region and over the N well region. The composite silicon layer is disconnected at the STI region. Gate electrodes are then formed on the composite layer in the NMOS and PMOS regions.

In another embodiment, a method of forming a CMOS integrated circuit is provided. The method includes providing a first region of a semiconductor substrate to be used as an NMOS region, and providing a second region of the semiconductor substrate to be used as a PMOS region. Isolation regions are formed in the semiconductor substrate, a P well region is formed in the NMOS region, and an N well region is formed in the PMOS region. A composite silicon layer is deposited over the P well region and over the N well region, with the composite silicon layer forming openings located at the isolation regions. The composite silicon layer includes a strained SiGe layer. Insulator material is deposited in the openings and gate electrodes are formed on the composite layer in the NMOS and PMOS regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
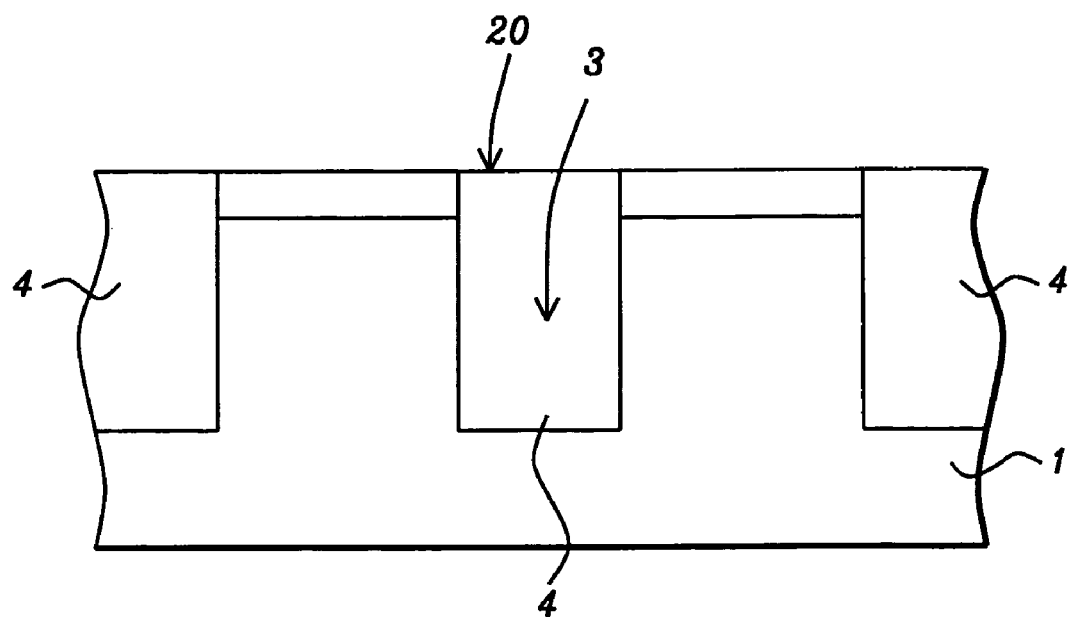
FIGS. 1–4, 6–9, which schematically, in cross-sectional style, describe key stages used to fabricate CMOS devices featuring a channel region comprised with a selectively grown, composite silicon layer, which in turn is comprised with a SiGe layer sandwiched between thin silicon buffer layers, is described.

The method of fabricating a CMOS device featuring a composite silicon layer, comprised of at least a SiGe layer and an overlying silicon layer, selectively grown on active device regions of a semiconductor substrate prior to growth of a gate insulator layer, will now be described in detail. Semiconductor substrate 1, comprised of single crystalline P type silicon featuring a <100> crystallographic orientation, is used and schematically shown in FIG. 1. Silicon nitride layer 2, at a thickness between about 1000 to 2000 Angstroms, is formed on the top surface of semiconductor substrate 1 via low pressure chemical vapor deposition (LPCVD) or plasma enhanced chemical vapor deposition (PECVD) procedures. Conventional photolithographic and reactive ion etching (RIE) procedures are used to define shallow trench shapes 3 in silicon nitride layer 2, and to a depth between about 3000 to 6000 Angstroms in semiconductor substrate 1. The RIE procedure is performed using $Cl_2$ as an etchant for both silicon nitride layer 2, and semiconductor substrate 1. After removal of the photoresist shape used to define shallow trench shapes 3 via plasma oxygen ashing procedures, silicon oxide layer 4 is deposited via LPCVD or PECVD procedures at a thickness between about 4000 to 10000 Angstroms, using tetraethylorthosilicate (TEOS) as a source, completely filling shallow trench shapes 3. A chemical mechanical polishing (CMP) procedure is then employed to remove portions of silicon oxide layer 4, from the top surface of silicon nitride layer 2, resulting in silicon oxide filled STI regions 20, schematically shown in FIG. 1. The CMP procedure selectively terminates on silicon nitride layer 2.

Figure 2:
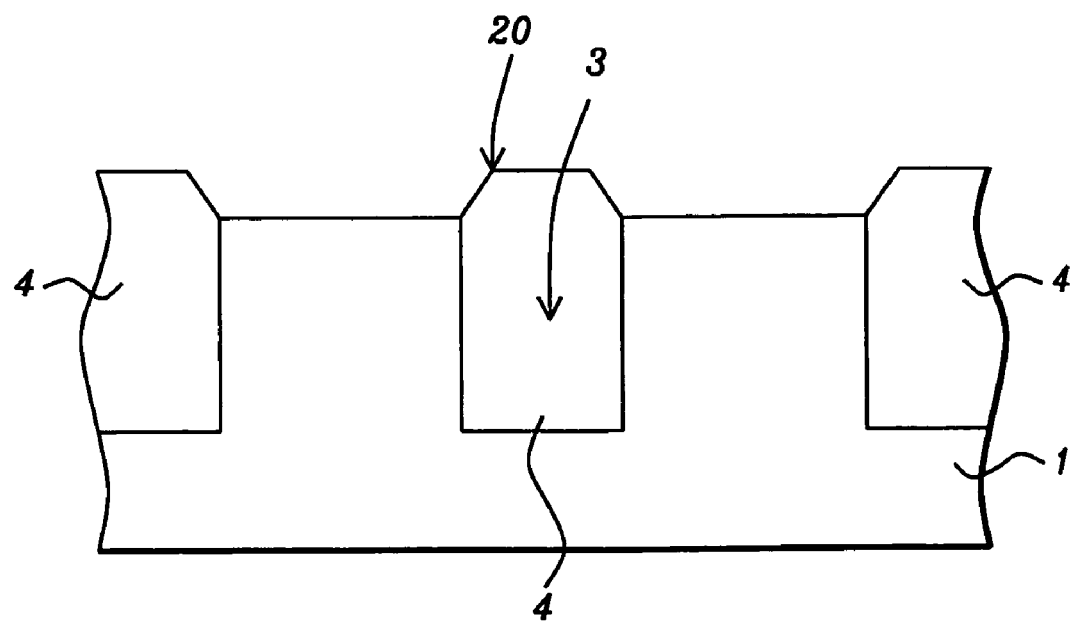
Figure 3:
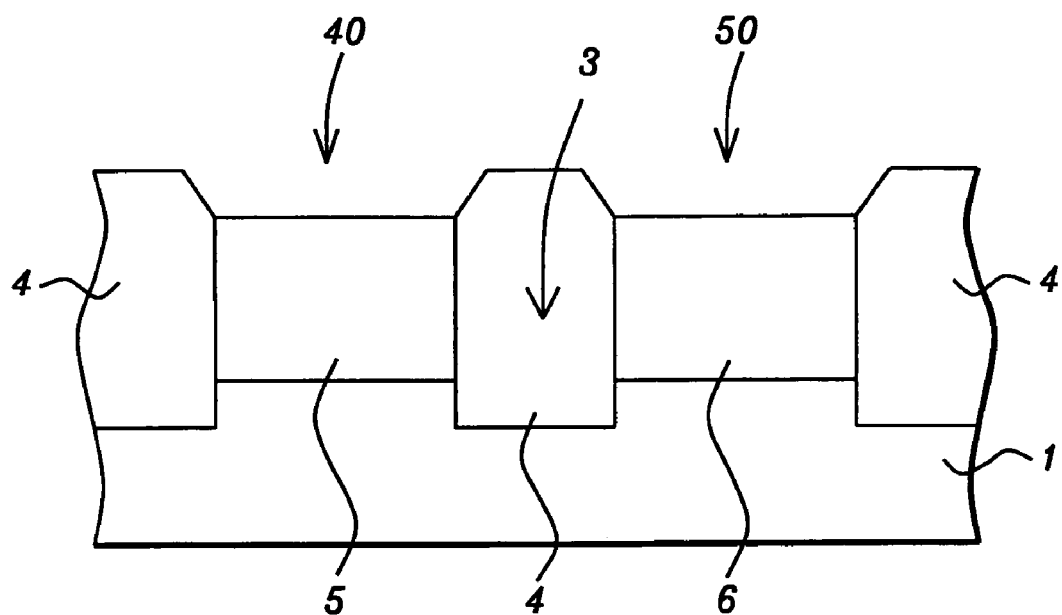

The removal of silicon nitride layer 2 via wet etch procedures using phosphoric acid as an etchant is next conducted, with the etch procedure also presenting an isotropic component resulting in a tapered profile for the top portion of STI regions 20 with the top portions of STI regions 20 extending above the top surface of semiconductor substrate 1. This is schematically shown in FIG. 2. The formation of well regions is next addressed and schematically shown in FIG. 3. A photoresist shape (not shown in the drawings), is first used to block a portion of semiconductor substrate 1 from an ion implantation procedure performed using boron ions at an energy between about 100 to 400 KeV, and at a dose between about 1E12 to 1E14 atoms/cm$^2$, creating P well region 5. At this stage of the CMOS fabrication procedure additional ion implantation procedures can be used to adjust the threshold voltage of the NMOS and PMOS devices, in addition to adjusting portions of the substrate to offer greater protection against punch-through phenomena. The region of semiconductor substrate 1 in which P well 5 resides will be designated as NIvIOS region 40, to be used to accommodate NMOS devices. After removal of the photoresist block out shape, another photoresist shape (not shown in the drawings) is used to protect NMOS region 40 from implantation of arsenic or phosphorous ions, performed at an energy between 100 to 500 KeV, at a dose between about 1E12 to 1E14 atoms/cm$^2$ resulting in the formation of N well region 6 in a portion of semiconductor substrate 1, designated as PMOS region 50, to be used to accommodate PMOS devices. If not previously performed threshold adjust and anti-punch through implants may now be performed. Removal of the photoresist block out shapes is accomplished via plasma oxygen ashing procedures.

Figure 4:
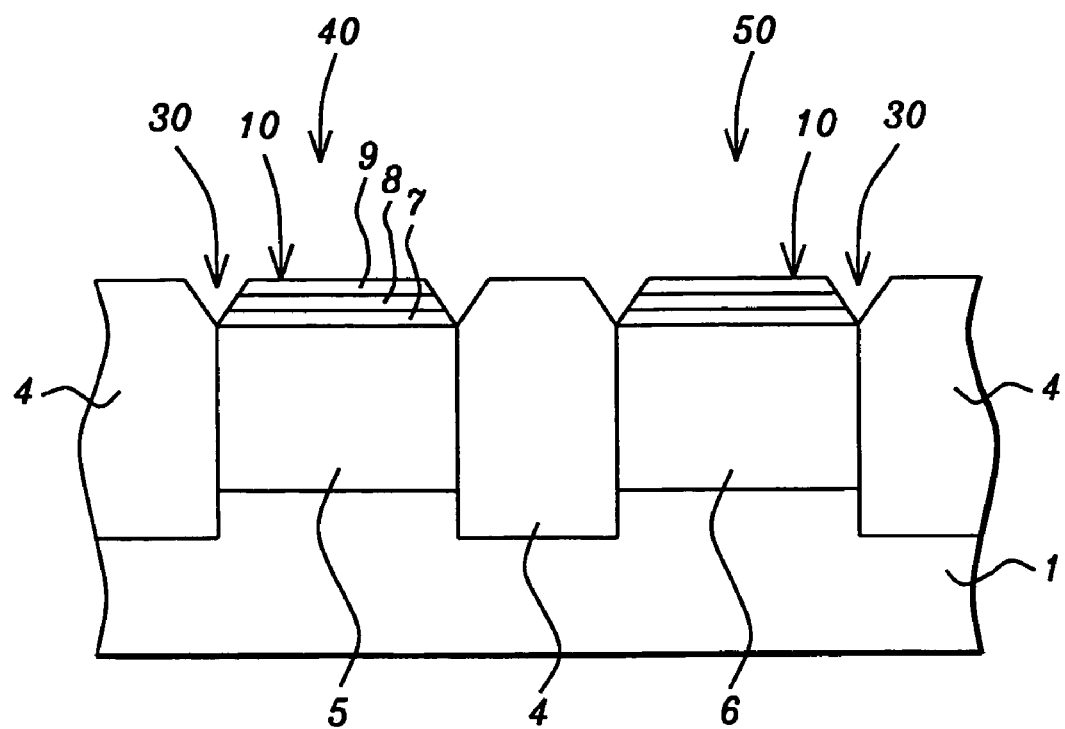

After a pre-clean procedure performed using a dilute or buffered hydrofluoric acid solution, composite silicon layer 10 is selectively grown on exposed semiconductor surfaces. An ultra-high vacuum chemical vapor deposition (UHV-CVD) procedure is employed at a temperature between about 400 to 800° C. To obtain the desired selective growth specific conditions, such as the growth temperature (shown above), in addition to a pressure of less than 200 mtorr, have to be employed. The addition of chlorine gas or HCl gas enhances the selectivity of the epitaxial growth. The growth of composite silicon layer 10, shown schematically in FIG. 4, initiates with the growth of optional underlying undoped silicon layer 7, selectively grown using silane (SiH$_4$), or disilane (Si$_2$H$_6$), as a source, to a thickness between about 0 to 100 Angstroms. This is followed by the selective growth of undoped SiGe layer 8, at a thickness between about 20 to 150 Angstroms, using silane (SiH$_4$)or disilane (Si$_2$H$_6$), and germanium (GeH$_4$) as reactants. The objective of growing a strained SiGe layer is achieved using a germanium weight percent between about 20 to 40. The thickness is chosen to be sufficient enough to contain the inversion charge, however not thick enough to allow defect to lead to unwanted device leakage. Finally overlying undoped silicon layer 9, is selectively grown to a thickness between about 5 to 100 Angstroms, again using silane or disilane as a source. Overlying silicon layer 9, is used as a capping layer, allowing a silicon dioxide gate insulator layer to be subsequently formed using silicon located in a top portion of this layer. The selective growth of composite silicon layer 10, results in a tapered sidewall, which in combination with the tapered profile of the top portion of STI region 4, result in V-groove shape 30, located between the tapered shapes of composite silicon layer 10, and STI regions 4. This is illustrated schematically in FIG. 4.

Figure 5:
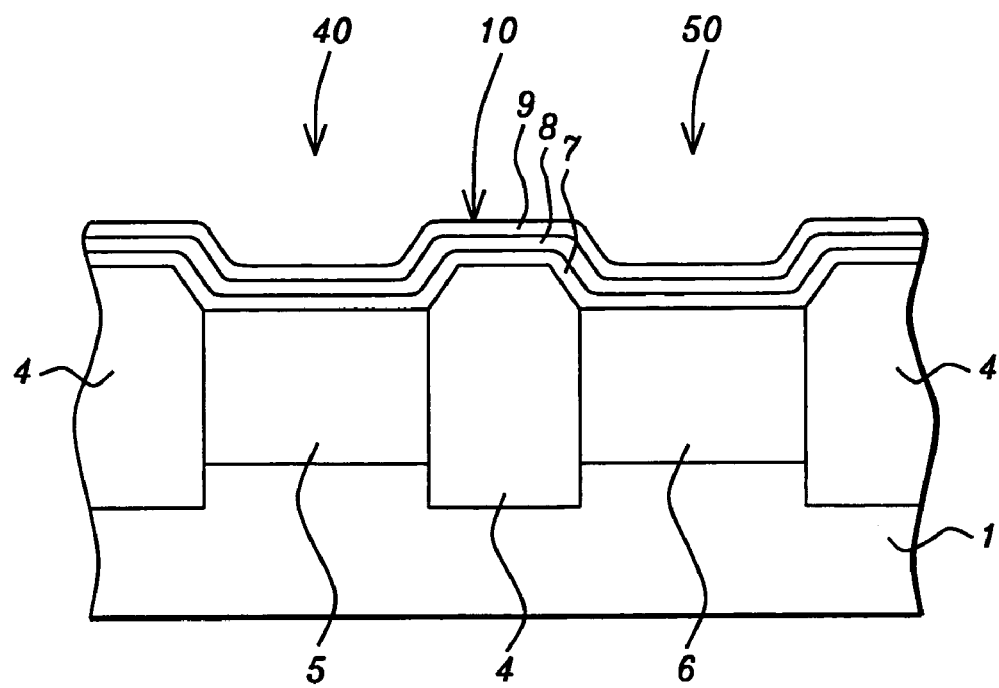
FIG. 5, which schematically, in cross sectional style, shows a key stage of a CMOS process featuring a non-selectively grown, composite silicon layer, to be defined as a component of the CMOS device channel region.

A second embodiment of this invention relates to the non-selective growth of composite silicon layer 10. Composite silicon layer 10, is again comprised of an optional underlying, undoped silicon layer 7, a SiGe layer 8, and an overlying, undoped silicon layer 9, all at the same thickness as used with the first embodiment featuring the selective silicon growth option. However to form a non-selective silicon layer the growth temperature used, unlike the selective silicon counterpart, is between about 400 to 800° C., in addition to employing a pressure less than 200 mtorr. This is schematically illustrated in FIG. 5. The second embodiment, or the use of non-selective silicon growth, will subsequently require a patterning procedure to remove portions of the non-selective silicon layer from non-active device regions, such as from the top surface of STI regions 4.

Figure 6:
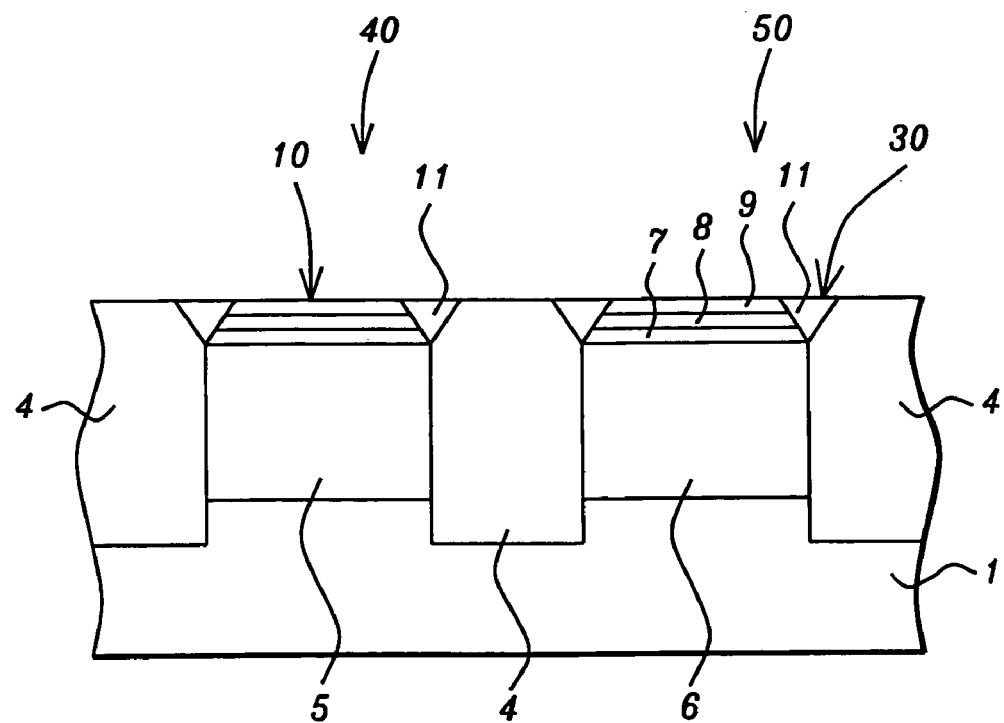

The filling of V-grooves 30, with insulator, employed as an option or modification in this invention, is next addressed and schematically shown in FIG. 6. Insulator layer 11, comprised of either silicon oxide or silicon nitride, is deposited via LPCVD or PECVD procedures, to a thickness between about 100 to 1000 Angstroms, completely filling V-grooves 30. A reactive ion etch (RIE) procedure is then used to selectively remove the insulator layer 11, from the top surface of composite silicon layer 10, resulting insulator filled V-grooves. The high etch rate ratio of insulator layer 11, to silicon, using CHF$_3$ or CF$_4$, as an etchant, allows the selective RIE procedure to be easily terminated at the appearance of the top surface of composite silicon layer 10. If desired a chemical mechanical polishing procedure can be used to remove portions of insulator layer 11, from the top surface of composite silicon layer 10, again resulting in the formation of insulator filled, V-grooves.

Figure 7:
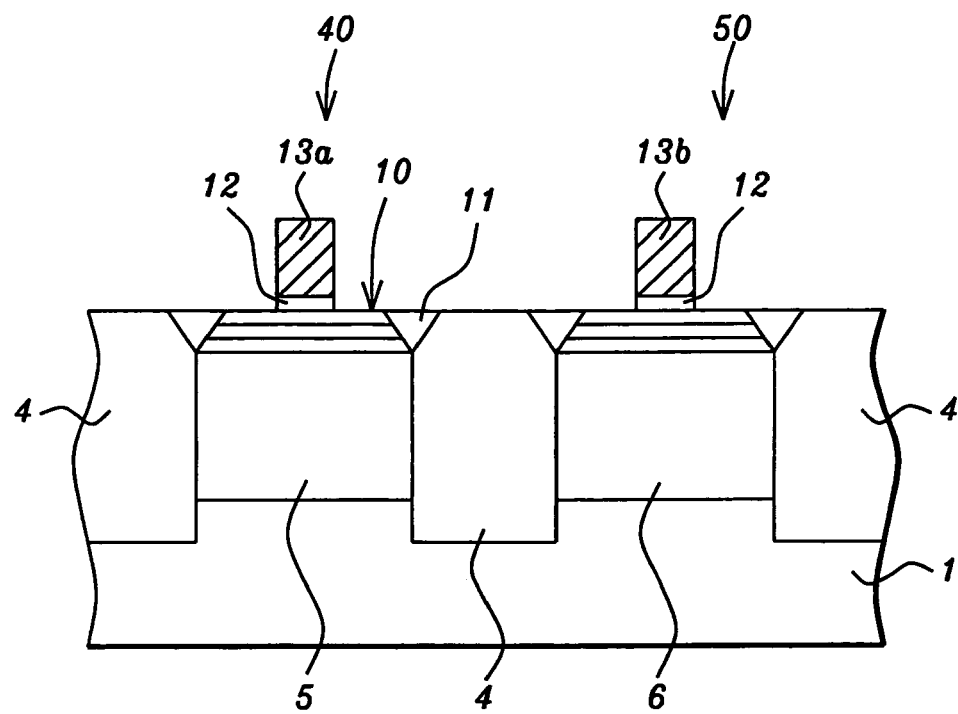

Thermal oxidation procedures are next employed at a temperature between about 600 to 900° C., in an oxygen-steam ambient, resulting in the growth of silicon dioxide gate insulator layer 12, at a thickness between about 5 to 80 Angstroms. Silicon dioxide gate insulator layer 12, was obtained consuming only a top portion of overlying silicon layer 9. The presence of overlying silicon layer 9, prevented the thermal oxidation procedure from consuming portions of strained SiGe layer 8, which would have resulted in a silicon dioxide layer exhibiting poorer dielectric characteristics than the silicon oxide gate insulator layer grown from an underlying non-Ge, silicon layer. An undoped polysilicon layer is next deposited at a thickness between about 500 to 2000 Angstroms, via LPCVD procedures. Conventional photolithographic and anisotropic RIE procedures, using Cl$_2$ or SF$_6$ as an etchant are used to define polysilicon gate structure 13$a$, in NMOS region 40, and polysilicon gate structure 13$b$, residing in PMOS region 50. The width of the polysilicon gate structures is between about 180 to 5000 Angstroms. Removal of the photoresist shape, (not shown in the drawings), used as a defining mask for the polysilicon gate structures, is then removed via plasma oxygen ashing procedures and careful wet cleans. The wet clean procedures include the use of a buffered or dilute HF cycle which remove exposed portions, or portions of silicon dioxide gate insulator layer 12, not covered by the polysilicon gate structures, from the top surface of composite silicon layer 10. The result of these procedures is schematically shown in FIG. 7.

Figure 8:
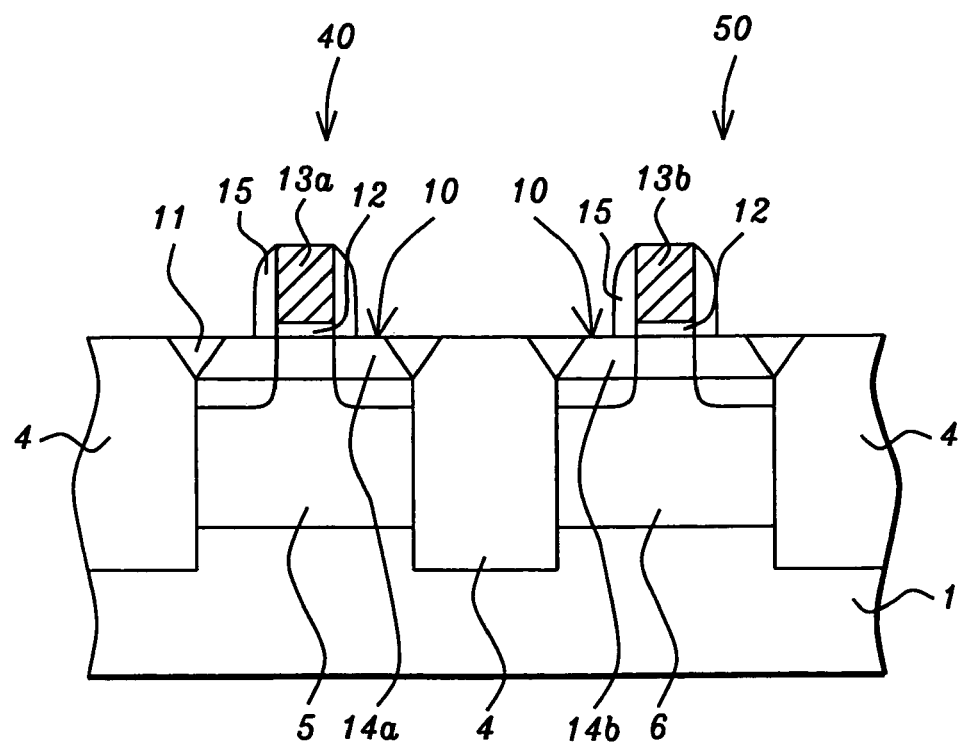

Lightly doped source/drain (LDD), regions, or source/drain extensions are next formed in both NMOS region 40, and PMOS region 50. For purposes of clarity composite silicon layer 10, will now be displayed without showing each of the three silicon components. A photoresist shape, (not shown in the drawings), is used to block NMOS region 40, from implantation of boron ions, performed at an energy less than 5 KeV, and at a dose between about 1E15 to 1E16 atoms/cm$^2$, resulting in P type, LDD region 14b, in the portion of PMOS region 50, or in a region of composite silicon layer 10, not covered by polysilicon gate structure 13b. After removal of the NMOS block out photoresist shape, another photoresist block out shape is formed on PMOS region 50, allowing implantation of arsenic or phosphorous ions, at an energy less than 10 KeV, and at a dose between about 1E15 to 1E16 atoms/cm$^2$, to create N type, LDD region 14a, in a region of NMOS region 40, or in a region of composite silicon layer 10, not covered by the photoresist block out shape or by polysilicon gate structure 13a. After removal of the PMOS block out photoresist shape a silicon nitride layer is deposited via LPCVD or PECVD procedures, to a thickness between about 500 to 2000 Angstroms. An anisotropic RIE procedure using SF$_6$ as an etchant is used to define silicon nitride spacers 15, on the sides of the polysilicon gate structures. The result of these procedures is schematically shown in FIG. 8

Figure 9:
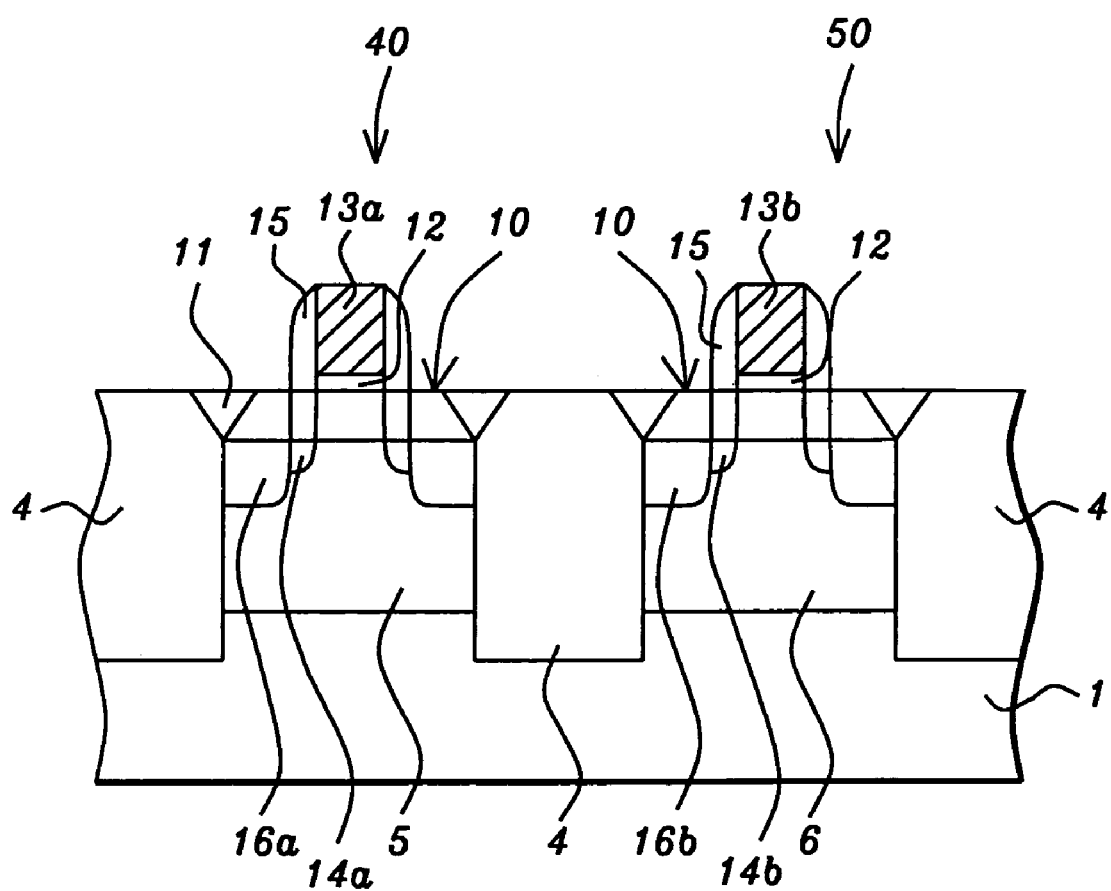

Formation of the heavily doped source/drain regions are next addressed and schematically shown in FIG. 9. A photoresist block out shape is used to protect the NMOS region 40, from implantation of boron ions into a portion of PMOS region 50, not covered by polysilicon gate structure 13b, or by silicon nitride spacers 15. The implantation procedure is performed at an energy between about 1 to 20 KeV, and at a dose between about 1E15 to 1E16 atoms/cm$^2$ After removal of the photoresist shape used to block out NMOS region 40, another photoresist shape is formed overlying PMOS region 50, allowing arsenic or phosphorous ions to be implanted into portions of NMOS region 40, not covered by polysilicon gate structure 13a, or by silicon nitride spacers 15. After removal of the photoresist shape used to protect PMOS region 50, from the N type implantation procedure, an anneal procedure is employed to activate the P type, and N type implanted ions, resulting in heavily doped P type source/drain region 16b, in PMOS region 50, and in heavily doped N type source/drain region 16a, in NMOS region 40. The anneal procedure was accomplished using rapid thermal annealing (RTA), performed at a temperature between about 925 to 1075° C., for a time between about 0 to 30 sec. The presence of SiGe layer 8, as a component of composite silicon layer 10, helps to restrict excessive diffusion of activated boron in the vertical direction that would lead to increased source/drain junction depth and degraded short-channel performance.

Completion of the CMOS process sequence, featuring a composite silicon layer comprised of at least a SiGe layer and an overlying silicon layer, entails formation of metal silicide layers on the top surface of the polysilicon gate structures, and on the top surface of the heavily doped source/drain regions. Several alternatives to forming the metal silicide layer directly on the composite silicon layer, in which unwanted agglomeration of germanium may occur at the boundaries of the silicide layer, can be employed. First the composite silicon layer can be removed prior to metal silicide formation, specifically after silicon nitride spacer formation. A second alternative is an additional selective epitaxial growth of silicon, used to form a raised source/drain region, so that a subsequent silicide formation procedure would not consume the underlying SiGe layer. The metal used for silicide formation, in either of the above alternatives can be chosen from a group that contained such candidates as titanium, tantalum cobalt, nickel, or tungsten. After deposition of the metal layer, anneal procedures are used to form the metal silicide layer on the gate and source/drain elements, followed by removal of unreacted metal from the surface of the spacers and STI regions.

While this invention has been particularly shown and described with reference to, the preferred embodiments thereof, it will be understood by those skilled in the art that various changes in form and details may be made without departing from the spirit and scope of this invention.

What is claimed is:

1. A method of forming a CMOS integrated circuit comprising:
   providing a first region of a semiconductor substrate to be used as an NMOS region, and providing a second region of said semiconductor substrate to be used as a PMOS region;
   forming isolation regions in said semiconductor substrate;
   forming a P well region in said NMOS region, and forming an N well region in said PMOS region;
   forming a composite silicon layer over said P well region and over said N well region, with said composite silicon layer forming openings located at the isolation regions, said composite silicon layer comprising a strained SiGe layer;
   providing insulator material in the openings; and
   forming gate electrodes on the composite layer in said NMOS and PMOS regions.

2. The method of claim 1 wherein said isolation regions are silicon oxide filled shallow trenches.

3. The method of claim 2 wherein the trenches are formed to a depth between about 3000 to 6000 Angstroms in said semiconductor substrate.

4. The method of claim 1 wherein said openings are V-groove openings.

5. The method of claim 1 wherein the composite silicon layer includes an underlying silicon layer, said strained SiGe layer, and an overlying silicon layer.

6. The method of claim 2 wherein said shallow trenches include at least one tapered side and said opening of said composite layer being formed at the tapered side.

7. The method of claim 1, wherein said strained SiGe layer of said composite silicon layer is selectively grown to a thickness between about 20 to 150 Angstroms.

8. The method of claim 1, wherein said strained SiGe layer of said composite silicon layer is selectively grown with a germanium content between about 20 to 40 weight percent.

9. The method of claim 5 wherein said overlying silicon layer of said composite silicon layer is selectively grown to a thickness between about 5 to 100 Angstroms.

* * * * *